United States Patent
Fujii

(10) Patent No.: US 10,879,814 B2
(45) Date of Patent: Dec. 29, 2020

(54) MULTILEVEL POWER CONVERTER

(71) Applicant: TOSHIBA MITSUBISHI-ELECTRIC INDUSTRIAL SYSTEMS CORPORATION, Chuo-ku (JP)

(72) Inventor: Yosuke Fujii, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 160 days.

(21) Appl. No.: 16/087,786

(22) PCT Filed: Apr. 8, 2016

(86) PCT No.: PCT/JP2016/061584
§ 371 (c)(1),
(2) Date: Sep. 24, 2018

(87) PCT Pub. No.: WO2017/175394
PCT Pub. Date: Oct. 12, 2017

(65) Prior Publication Data
US 2020/0212821 A1 Jul. 2, 2020

(51) Int. Cl.
*H02M 7/487* (2007.01)
*H02M 7/00* (2006.01)
*H02M 7/483* (2007.01)

(52) U.S. Cl.
CPC .......... *H02M 7/487* (2013.01); *H02M 7/003* (2013.01); *H02M 2007/4835* (2013.01)

(58) Field of Classification Search
CPC .................. H02M 7/487; H02M 7/003; H02M 2007/4835
See application file for complete search history.

(56) References Cited

U.S. PATENT DOCUMENTS

| 2016/0028224 A1 | 1/2016 | Yamada et al. |
| 2016/0094153 A1* | 3/2016 | Li ............... H02M 7/487 363/123 |
| 2016/0344301 A1 | 11/2016 | Maruyama et al. |

(Continued)

FOREIGN PATENT DOCUMENTS

| CN | 203504422 U | 3/2014 |
| CN | 105379098 A | 3/2016 |

(Continued)

OTHER PUBLICATIONS

Extended European Search Report dated Oct. 23, 2019 in Patent Application No. 16897950.8, citing documents AA-AB, AO-AQ, and AX-AY therein, 7 pages.

(Continued)

*Primary Examiner* — Jeffrey A Gblende
*Assistant Examiner* — Kevin H Sprenger
(74) *Attorney, Agent, or Firm* — Oblon, McClelland, Maier & Neustadt, L.L.P.

(57) ABSTRACT

In a multilevel power converter (20), a power conversion circuit is formed of semiconductor modules (1 to 4), the multilevel power converter (20) includes: a capacitor (5) on the positive electrode side; a capacitor (6) on the negative electrode side; an AC bus (L1); a capacitor bus (L2); a positive electrode bus (L3); and a negative electrode bus (L4), and the semiconductor modules (1 to 4) are arranged such that the inductance in a communication loop is reduced.

8 Claims, 12 Drawing Sheets

(56) References Cited

U.S. PATENT DOCUMENTS

| | | | | |
|---|---|---|---|---|
| 2017/0079132 | A1* | 3/2017 | Bayerer | H05K 1/181 |
| 2018/0145604 | A1* | 5/2018 | Kadota | H01L 23/3672 |
| 2018/0183350 | A1* | 6/2018 | Kadota | H02M 7/003 |

FOREIGN PATENT DOCUMENTS

| | | |
|---|---|---|
| CN | 105450042 A | 3/2016 |
| EP | 2 966 768 A1 | 1/2016 |
| JP | 2014-36509 A | 2/2014 |
| WO | WO 2016/031295 A1 | 3/2016 |

OTHER PUBLICATIONS

Chen, C. et al. "Investigation, Evaluation, and Optimization of Stray Inductance in Laminated Busbar" IEEE Transactions on Power Electronics, vol. 29, No. 7, XP011540343, 2014, 15 pages.

Popova, L. et al. "Modelling of Low Inductive Busbars for Medium Voltage Three-level NPC Inverter" Power Electronics and Machines in Wind Applications, XP032245150, 2012, 7 pages.

International Preliminary Report on Patentability and Written Opinion dated Oct. 18, 2018 in PCT/JP2016/061584 (submitting English translation only).

Combined Chinese Office Action and Search Report dated Dec. 2, 2019 in Patent Application No. 201680084098.0 (with English translation), citing documents AO and AP therein, 19 pages.

International Search Report dated Jun. 14, 2016, in PCT/JP2016/061584, filed Apr. 8, 2016.

Indian Office Action dated Jun. 8, 2020 in Indian Patent Application No. 201817040335, 5 pages.

Chinese Office Action dated Jun. 15, 2020 in Chinese Patent Application No. 201680084098.0 (with English language machine translation), 16 pages.

* cited by examiner

MULTILEVEL POWER CONVERTER

FIELD

The present invention relates to a multilevel power converter.

BACKGROUND

In general, there is known a technique in which a multilevel power converter is formed of semiconductor modules such as switching elements.

For example, a three-level power converter is disclosed in which the circuit inductance in a power conversion circuit is suppressed, ease of maintenance is enhanced and, at the same time, manufacturing costs can be reduced (see PTL 1).

However, when a multilevel power converter is formed of semiconductor modules, a line portion of a power conversion circuit has a low degree of freedom in regard to length due to physical restrictions. Accordingly, when the inductance in a communication loop, which is generated at the time of turning off switching elements, increases, a surge voltage increases.

CITATION LIST

Patent Literature

[PTL 1] JP 2014-36509 A

SUMMARY

It is an object of the present invention to provide a multilevel power converter which is formed of semiconductor modules, and in which a surge voltage at the time of turning off a switching element can be suppressed.

A multilevel power converter according to an aspect of the present invention is a multilevel power converter in which a power conversion circuit is formed of a plurality of semiconductor modules, the multilevel power converter including: a first capacitor provided in a positive electrode circuit; a second capacitor connected with the first capacitor in series, and provided in a negative electrode circuit; a first electric circuit formed of a first switching element through which an electric current flows from the positive electrode circuit to an AC circuit, and a first diode connected with the first switching element in anti-parallel; a second electric circuit formed of a second switching element, and a second diode connected with the second switching element in series, the second electric circuit being configured to form an electric path which connects a capacitor circuit formed of the first capacitor and the second capacitor and the AC circuit with each other; a third electric circuit formed of a third switching element, and a third diode connected with the third switching element in series, the third electric circuit being configured to form an electric path which connects the capacitor circuit and the AC circuit with each other, and through which an electric current flows in a direction opposite to the second electric circuit; a fourth electric circuit formed of a fourth switching element through which an electric current flows from the AC circuit to the negative electrode circuit, and a fourth diode connected with the fourth switching element in anti-parallel; an AC bus which is laminated, the AC bus forming the AC circuit; a capacitor bus which is laminated, the capacitor bus being stacked with the AC bus and configured to form the capacitor circuit; a positive electrode bus which is laminated, the positive electrode bus being stacked with the AC bus and the capacitor bus and configured to form the positive electrode circuit; and a negative electrode bus which is laminated, the negative electrode bus being stacked with the AC bus and the capacitor bus and configured to form the negative electrode circuit, wherein the plurality of semiconductor modules are arranged such that each of the first electric circuit and the fourth electric circuit is adjacent to either one of the second electric circuit or the third electric circuit so as to reduce inductance in a communication loop.

DESCRIPTION OF EMBODIMENTS

First Embodiment

Figure 1:
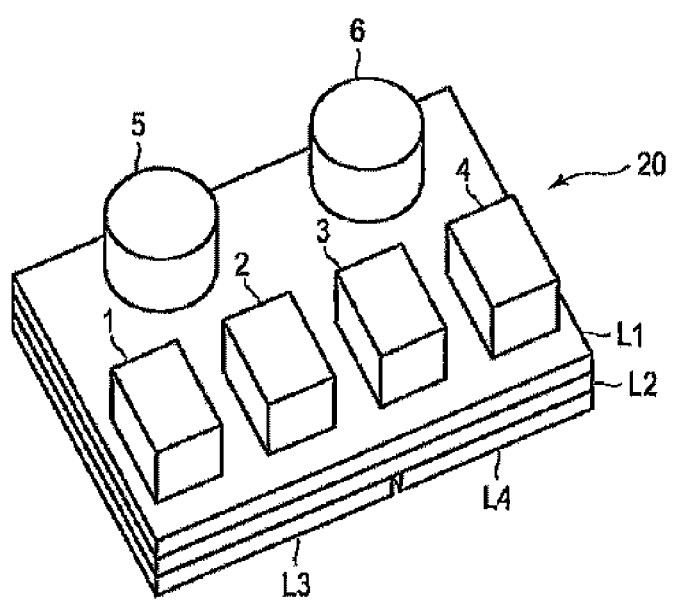
FIG. 1 is a configuration diagram showing a configuration of a three-level power converter according to a first embodiment of the present invention.
Figure 2:
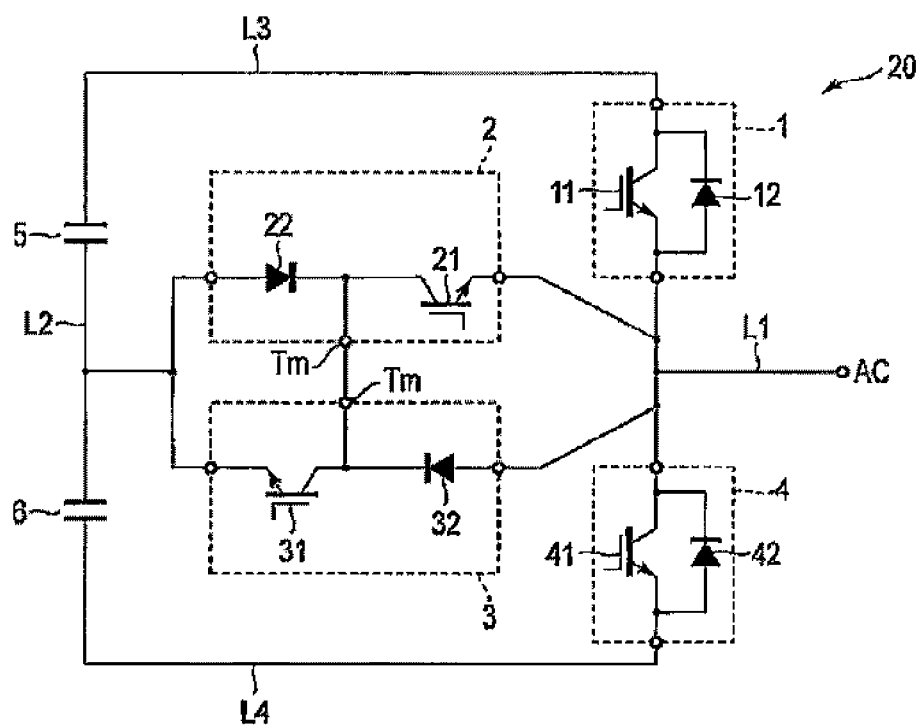
FIG. 2 is a circuit diagram showing a configuration of a power conversion circuit of the three-level power converter according to the first embodiment.

FIG. 1 is a configuration diagram showing a configuration of a three-level power converter 20 according to a first embodiment of the present invention. FIG. 2 is a circuit diagram showing a configuration of a power conversion circuit of the three-level power converter 20 according to this embodiment. In the drawings, identical components are given the same reference characters, and the detailed description of such components is omitted. The description is made primarily with respect to the different components.

The three-level power converter 20 is a neutral-point-switch-type three-level (multi) level inverter. In this embodiment, the description is made with respect to the configuration of one of three phases of the power conversion circuit. However, it is assumed that all phases have the same configuration. Further, the description is primarily made with the assumption that the three-level power converter 20 performs reverse conversion from DC power to AC power. However, the three-level power converter 20 may perform rectification from AC power to DC power. Further, the power conversion circuit may have three phases, or may have a single phase. The three-level power converter 20 may be a power converter of more than three levels provided that the power converter has a configuration substantially equal to the configuration of this embodiment.

The three-level power converter 20 includes four semiconductor modules 1, 2, 3, 4, two capacitors 5, 6, and four laminated buses L1, L2, L3, L4.

The laminated buses L1 to L4 are conductors which are laminated (having a thin-plate shape). The AC bus L1 forms an AC circuit of the power conversion circuit, and includes an AC terminal. The capacitor bus L2 is connected to the two capacitors 5, 6, mid forms a capacitor circuit of the power conversion circuit. The positive electrode bus L3 forms a positive electrode circuit of the power conversion circuit, and includes a positive electrode terminal. The negative electrode bus L4 forms a negative electrode circuit of the power conversion circuit, and includes a negative electrode terminal.

The laminated buses L1 to L4 have a rectangular parallelepiped plate shape. The AC bus L1 and the capacitor bus L2 have substantially the same shape. The positive electrode bus L3 and the negative electrode bus L4 have a shape which is substantially half the shape of the AC bus L1 or the capacitor bus L2. Assume the side on which the semiconductor modules 1 to 4 and the capacitors 5, 6 are mounted as the upper side, the AC bus L1, the capacitor bus L2, the positive electrode bus L3 or the negative electrode bus L4 are stacked in this order from the top. The positive electrode bus L3 and the negative electrode bus L4 are disposed adjacent to each other in the lateral direction without overlapping. Accordingly, when the stacked laminated buses L1 to L4 are viewed in a side view, the positive electrode bus L3 and the negative electrode bus L4 are set in one layer. Accordingly, the laminated buses L1 to L4 form three layers in total. Insulation is provided between the respective laminated buses L1 to L4. The order of the laminated buses L1 to L4 to be stacked may be exchanged in any manner.

The first semiconductor module 1 includes a switching element 11 and a diode 12. The diode 12 is connected with the switching element 11 in anti-parallel. To be more specific, a collector (input side) of the switching element 11 and a cathode of the diode 12 are connected with each other, and an emitter (output side) of the switching element 11 and an anode of the diode 12 are connected with each other. The cathode of the diode 12 is connected to the positive electrode bus L3. The anode of the diode 12 is connected to the AC bus L1. In this embodiment, unless otherwise specified, the switching element 11 is described assuming that the switching element 11 is an IGBT (insulated gate bipolar transistor). However, the switching element 11 may be a switching element of another type such as a MOSFET (metal oxide semiconductor field-effect transistor). Further, other switching elements are described assuming that, in the same manner as the switching element 11, other switching elements are also IGBTs. However, other switching elements may also be switching elements of another type.

The second semiconductor module 2 includes a switching element 21 and a diode 22. The second semiconductor module 2 may further include a diode connected to the switching element 21 in anti-parallel. The switching element 21 is connected in series such that the direction of a flowing electric current is equal to the direction of a flowing electric current in the diode 22, and an electric current is inputted into the switching element 21 from the diode 22. To be more specific, a collector (input side) of the switching element 21 and a cathode of the diode 22 are connected with each other. An anode of the diode 22 is connected to the capacitor bus L2. An emitter (output side) of the switching element 21 is connected to the AC bus L1. With such a configuration, a current path through which an electric current flows from the capacitor circuit to the AC circuit is formed in the electric circuit of the second semiconductor module 2. A terminal Tm connected to a line, connecting the switching element 21 and the diode 22 with each other, is exposed to the outside of the second semiconductor module 2. The terminal Tm is connected to a terminal Tm of the third semiconductor module 3.

The third semiconductor module 3 includes a switching element 31 and a diode 32. The third semiconductor module 3 may further include a diode connected to the switching element 31 in anti-parallel. The switching element 31 is connected in series such that the direction of a flowing electric current is equal to the direction of a flowing electric current in the diode 32, and an electric current is inputted into the switching element 31 from the diode 32. To be more specific, a collector (input side) of the switching element 31 and a cathode of the diode 32 are connected with each other. An anode of the diode 32 is connected to the AC bus L1. With such a configuration, a current path through which an electric current flows from the AC circuit to the capacitor circuit is formed in the electric circuit of the third semiconductor module 3. That is, in the electric circuit of the third semiconductor module 3, an electric current flows in the opposite direction to the electric circuit of the second semiconductor module 2. An emitter (output side) of the switching element 31 is connected to the capacitor bus L2. The terminal Tm connected to a line, connecting the switching element 31 and the diode 32 with each other, is exposed to the outside of the third semiconductor module 3. The terminal Tm is connected to the terminal Tm of the second semiconductor module 2.

The fourth semiconductor module 4 includes a switching element 41 and a diode 42. The diode 42 is connected with the switching element 41 in anti-parallel. To be more specific, a collector (input side) of the switching element 41 and a cathode of the diode 42 are connected with each other, and an emitter (output side) of the switching element 41 and an anode of the diode 42 are connected with each other. The cathode of the diode 42 is connected to the AC bus L1. The anode of diode 42 is connected to the negative electrode bus L4.

Figure 3:
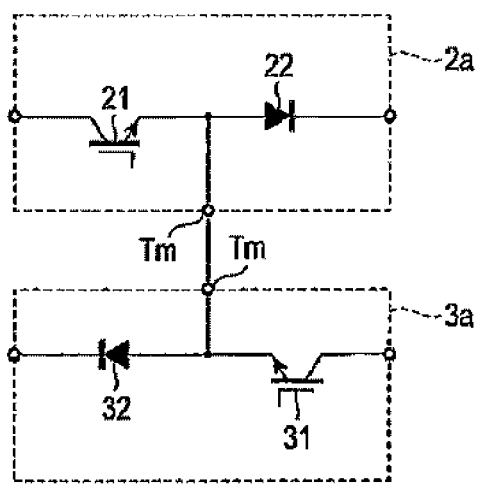
FIG. 3 is a circuit diagram showing configurations of electric circuits of a second semiconductor module and a third semiconductor module according to a modification of the first embodiment.

The second semiconductor module 2 and the third semiconductor module 3 may be respectively replaced with a second semiconductor module 2a and a third semiconductor module 3a according to a modification of this embodiment which are shown in FIG. 3. The configuration of a switching element 21a and a diode 22a of the second semiconductor module 2a shown in FIG. 3 is obtained by exchanging positions of the switching element 21 and the diode 22 of the second semiconductor module 2 shown in FIG. 2 with each other. The configuration of a switching element 31a and a diode 32a of the third semiconductor module 3a shown in FIG. 3 is obtained by exchanging positions of the switching element 31 and the diode 32 of the third semiconductor module 3 shown in FIG. 2 with each other.

The capacitors 5, 6 have a cylindrical shape. The capacitor 5 is a capacitor on the positive electrode side which is provided in the positive electrode circuit. The capacitor 6 is a capacitor on the negative electrode side which is provided in the negative electrode circuit. The capacitors 5, 6 are connected in series via the capacitor bus L2. Each capacitor 5, 6 may be formed of one capacitor, or may be formed of a plurality of unit capacitors.

Next, a method for mounting the four semiconductor modules 1 to 4 and the two capacitors 5, 6 is described.

The semiconductor modules 1 to 4 and the capacitors 5, 6 are disposed on a surface of the AC bus L1 which is present in an uppermost layer. The first semiconductor module 1, the second semiconductor module 2, the third semiconductor module 3, and the fourth semiconductor module 4 are arranged in this order in one lateral line. The capacitors 5, 6 are disposed parallel to each other in the lateral direction in a lint separate from the semiconductor modules 1 to 4. The semiconductor module 1 and the capacitor 5 are elements connected to the positive electrode bus L3 therefore these elements are disposed so as to be positioned above the positive electrode bus L3. The semiconductor module 4 and the capacitor 6 are elements connected to the negative electrode bus L4 therefore these elements are disposed so as to be positioned above the negative electrode bus L4.

Figure 4:
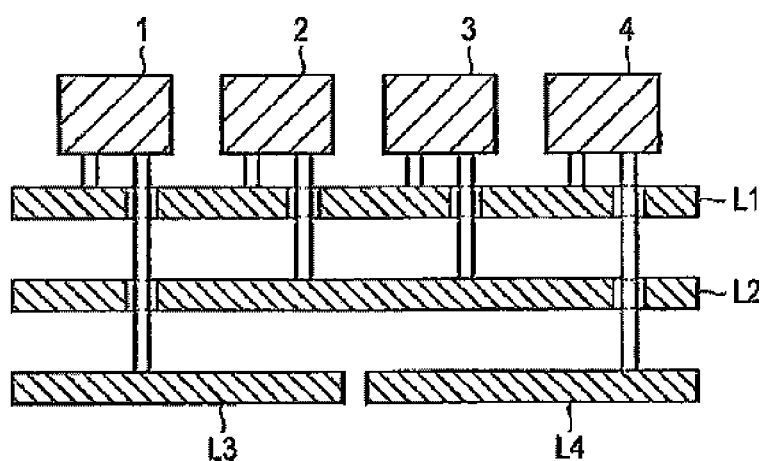
FIG. 4 is a side view showing a state where respective semiconductor modules according to the first embodiment are respectively connected to laminated buses.

FIG. 4 is a side cross-sectional view showing a state where semiconductor modules 1 to 4 are respectively connected to the laminated buses L1 to L4.

The first semiconductor module 1 is wired to the AC bus L1 and to the positive electrode bus L3. The AC bus L1 is present in the uppermost layer. An AC terminal of the first semiconductor module 1 is connected to a surface of the AC bus L1 disposed below the first semiconductor module 1. The positive electrode bus L3 is present in the lowermost layer. A positive electrode terminal of the first semiconductor module 1 penetrates the AC bus L1 and the capacitor bus L2, and is connected to the positive electrode bus L3 at a point where the positive electrode terminal reaches the positive electrode bus L3. Accordingly, a hole, which allows the positive electrode terminal of the first semiconductor module 1 to pass therethrough, is respectively formed in the AC bus L1 and the capacitor bus L2 in an overlapping manner. Insulation treatment is applied to these holes so as to prevent short-circuiting even if the positive electrode terminal of the first semiconductor module 1 comes into contact with the holes.

In the same manner, holes necessary for allowing terminals of other semiconductor modules 2 to 4 to pass therethrough are also formed in the AC bus L1 or the capacitor bus L2. Other semiconductor modules 2 to 4 are also wired in the same manner as the first semiconductor module 1. With such a configuration, the second semiconductor module 2 and the third semiconductor module 3 are wired to the AC bus L1 and to the capacitor bus L2. Further, the fourth semiconductor module 4 is wired to the AC bus L1 and to the negative electrode bus L4. Still further, the second semiconductor module 2 and the third semiconductor module 3 are connected with each other through the terminals Tm.

In the same manner as the semiconductor modules 1 to 4, holes necessary for allowing terminals of the capacitors 5, 6 to pass therethrough are formed in the AC bus L1 and the capacitor bus L2. The capacitors 5, 6 are wired to the positive electrode bus L3 or the negative electrode bus L4 and to the capacitor bus L2.

The semiconductor modules 1 to 4 are arranged such that the inductance in a circuit, through which a positive electric current flows, is reduced during a period where an AC voltage is zero or a positive AC voltage. With such a configuration, it is possible to reduce the inductance in a communication loop at the time of turning off the switching elements 11, 21, 31, 41 of the respective semiconductor modules 1 to 4. An electric current which flows through the communication loop flows through a path where an electric current flowing out from the AC side of the first semiconductor module 1 enters through the second semiconductor module 2, and through a path where an electric current flowing out from the AC side of the third semiconductor module 3 enters the fourth semiconductor module 4.

Accordingly, the first semiconductor module 1 is disposed adjacent to the second semiconductor module 2 such that the inductance in a path between the first semiconductor module 1 and the second semiconductor module 2 is reduced. Further, the third semiconductor module 3 is disposed adjacent to the fourth semiconductor module 4 such that the inductance in a path between the third semiconductor module 3 and the fourth semiconductor module 4 is reduced. In this embodiment, the first semiconductor module 1 and the second semiconductor module 2 are disposed adjacent to each other in the lateral direction. However, the first semiconductor module 1 and the second semiconductor module 2 may be disposed adjacent to each other in the vertical direction. In the same manner, the third semiconductor module 1 and the fourth semiconductor module 2 may also be disposed adjacent to each other in the vertical direction.

According to this embodiment, a three-level power conversion circuit, which primarily performs reverse conversion instead of rectification, is formed of four semiconductor modules 1 to 4, the first semiconductor module 1 and the second semiconductor module 2 are disposed adjacent to each other, and the third semiconductor module 3 and the fourth semiconductor module 4 are disposed adjacent to each other. With such a configuration, the inductance in the communication loop at the time of turning off the switching elements 11 to 41 can be reduced. Accordingly, it is possible to suppress a surge voltage at the time of turning off the switching elements 11 to 41. The three-level power conversion circuit may be a circuit which does not perform rectification but performs only reverse conversion.

The positive electrode bus L3 and the negative electrode bus L4 are disposed parallel to each other in the lateral direction without overlapping and hence, the inductance between the positive electrode bus L3 and the negative electrode bus L4 can be increased. Further, the elements 11, 12 connected to the positive electrode bus L3 and the elements 41, 42 connected to the negative electrode bus L4 are respectively present in identical semiconductor modules 1, 4, and the semiconductor modules 1, 4 are disposed so as to be positioned above the buses L3, L4 having polarities of the semiconductor modules which are to be connected. With such a configuration, the inductance in the communication loop on the opposite side is increased so that an unnecessary commutating operation can be suppressed.

Further, the positive electrode bus L3 and the negative electrode bus L4 are disposed parallel to each other in the lateral direction without overlapping and hence, the positive electrode bus L3 and the negative electrode bus L4 can be set in one layer. Accordingly, the three-level power converter can be miniaturized and hence, manufacturing costs can be reduced.

Second Embodiment

Figure 5:
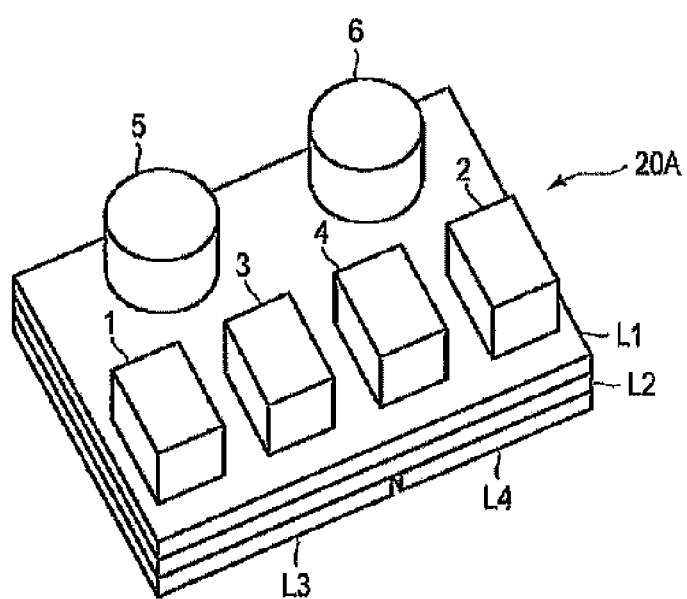
FIG. 5 is a configuration diagram showing a configuration of a three-level power converter according to a second embodiment of the present invention.
Figure 6:
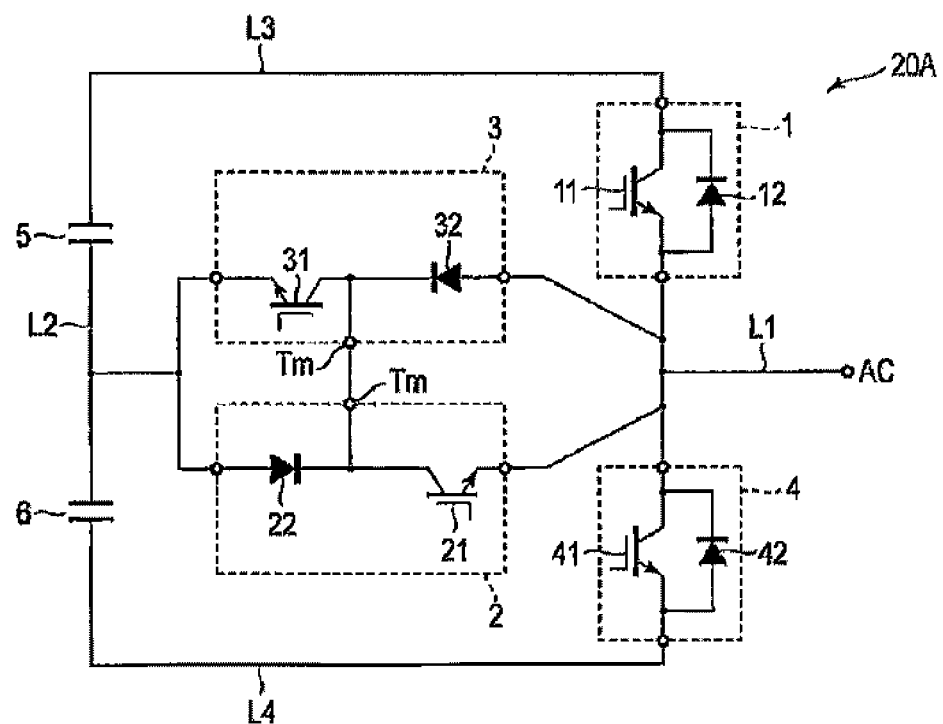
FIG. 6 is a circuit diagram showing a configuration of a power conversion circuit of the three-level power converter according to the second embodiment.

FIG. 5 is a configuration diagram showing a configuration of a three-level power converter 20A according to a second embodiment of the present invention. FIG. 6 is a circuit diagram showing a configuration of a power conversion circuit of the three-level power converter 20A according to this embodiment.

The three-level power converter 20A is a converter obtained by exchanging positions of the second semiconductor module 2 and the third semiconductor module 3 in the three-level power converter 20 according to the first embodiment. That is, a first semiconductor module 1 and a third semiconductor module 3 are disposed adjacent to each other, and a second semiconductor module 2 and a fourth semiconductor module 4 are disposed adjacent to each other. The three-level power converter 20A primarily performs rectification. Other configurations are substantially equal to the corresponding points in the first embodiment.

In the same manner as the first embodiment, the second semiconductor module 2 and the third semiconductor module 3 may be respectively replaced with the second semiconductor module 2a and the third semiconductor module 3a shown in FIG. 3.

According to this embodiment, a three-level power conversion circuit which primarily performs rectification instead of reverse conversion is formed of four semiconductor modules 1 to 4. The first semiconductor module 1 and the third semiconductor module 3 are disposed adjacent to each other, and the second semiconductor module 2 and the fourth semiconductor module 4 are disposed adjacent to each other. With such a configuration, it is possible to acquire substantially the same manner of operation and advantageous effects as the first embodiment. The three-level power conversion circuit may be a circuit which does not perform reverse conversion but performs only rectification.

Third Embodiment

Figure 7:
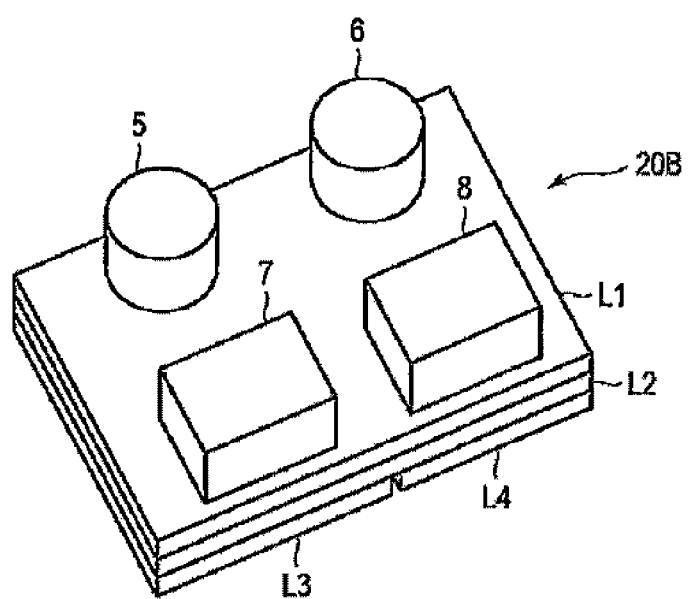
FIG. 7 is a configuration diagram showing a configuration of a three-level power converter according to a third embodiment of the present invention.
Figure 8:
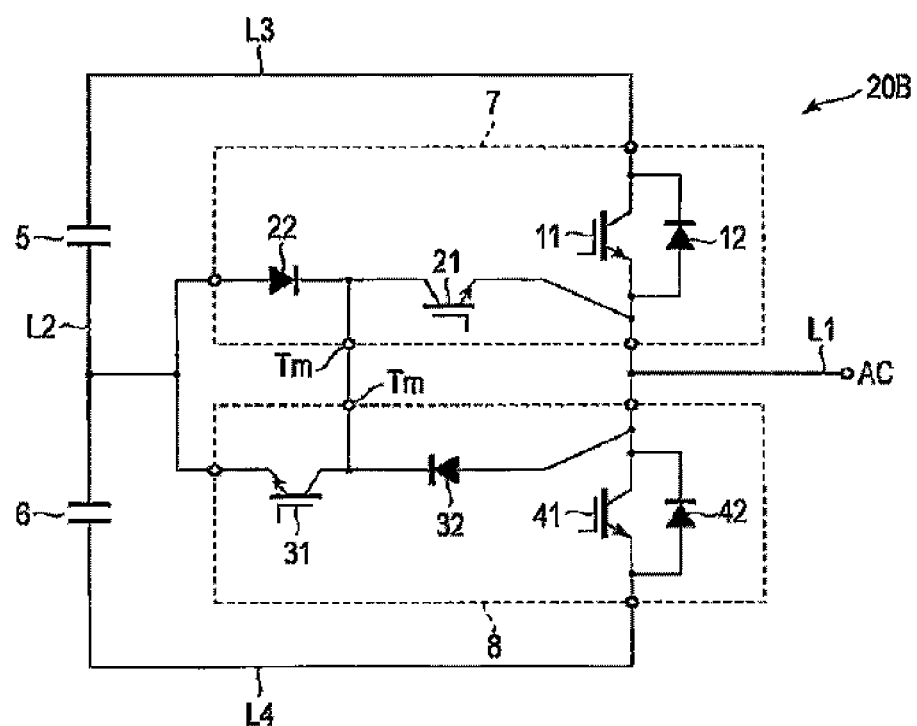
FIG. 8 is a circuit diagram showing a configuration of a power conversion circuit of the three-level power converter according to the third embodiment.

FIG. 7 is a configuration diagram showing a configuration of a three-level power converter 20B according to a third embodiment of the present invention. FIG. 8 is a circuit diagram showing a configuration of a power conversion circuit of the three-level power converter 20B according to this embodiment.

The three-level power converter 20B is a converter configured such that, in the three-level power converter 20 according to the first embodiment, a seventh semiconductor module 7 is provided as a substitute for the first semiconductor module 1 and the second semiconductor module 2, and an eighth semiconductor module 8 is provided as a substitute for the third semiconductor module 3 and the fourth semiconductor module 4. Other configurations are substantially equal to the corresponding points in the first embodiment.

The seventh semiconductor module 7 is a module obtained by forming the first semiconductor module 1 and the second semiconductor module 2 according to the first embodiment into one semiconductor module. To be more specific, the seventh semiconductor module 7 includes a switching element 11, a diode 12, a switching element 21, and a diode 22. An emitter of the switching element 11 is connected to an emitter of the switching element 21. With such a configuration, it is possible to reduce the wiring inductance between an electric circuit formed of the switching element 11 and the diode 12 and an electric circuit formed of the switching element 21 and the diode 22. Other configurations are substantially equal to the corresponding points in the configurations of the first semiconductor module 1 and the second semiconductor module 2 according to the first embodiment.

The eighth semiconductor module 8 is a module obtained by forming the third semiconductor module 3 and the fourth semiconductor module 4 into one semiconductor module. To be more specific, the eighth semiconductor module 8 includes a switching element 31, a diode 32, a switching element 41, and a diode 42. An anode of the diode 32 is connected to a collector of the switching element 41. With such a configuration, it is possible to reduce the wiring inductance between an electric circuit formed of the switching element 31 and the diode 32 and an electric circuit formed of the switching element 41 and the diode 42. Other configurations are substantially equal to corresponding configurations of the third semiconductor module 3 and the fourth semiconductor module 4.

Figure 9:
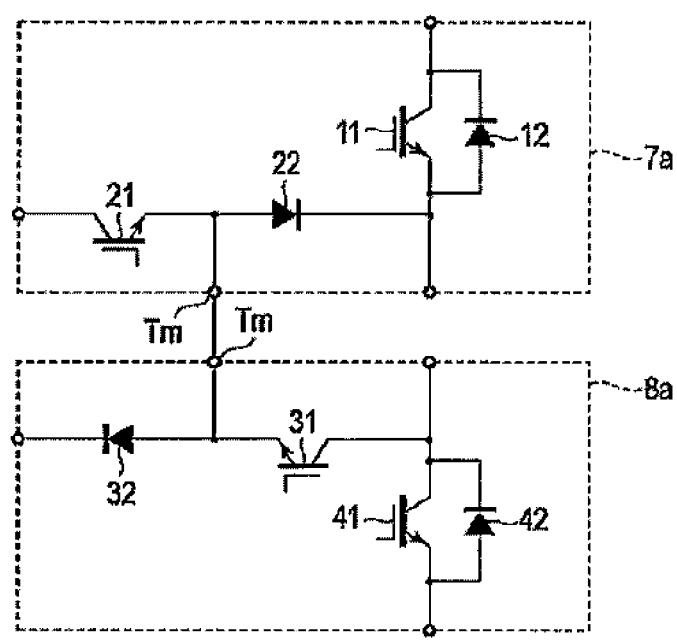
FIG. 9 is a circuit diagram showing configurations of electric circuits of a seventh semiconductor module and an eighth semiconductor module according to a modification of the third embodiment.

The seventh semiconductor module 7 and the eighth semiconductor module 8 may be respectively replaced with a seventh semiconductor module 7a and an eighth semiconductor module 8a according to a modification of this embodiment which are shown in FIG. 9. The configurations of a switching element 21a and a diode 22a of the seventh semiconductor module 7a shown in FIG. 9 are equal to corresponding configurations of the second semiconductor module 2a shown in FIG. 3. The configurations of a switching element 31a and a diode 32a of the eighth semiconductor module 8a shown in FIG. 9 are equal to corresponding configurations of the third semiconductor module 3a shown in FIG. 3.

According to this embodiment, it is possible to acquire substantially the same manner of operation and advantageous effects as the first embodiment.

Further, with the use of the seventh semiconductor module 7 and the eighth semiconductor module 8, even if the respective semiconductor modules 7, 8 are disposed at any position, the inductance in a communication loop at the time of turning off the switching elements 11 to 41 can be reduced. Accordingly, a surge voltage at the time of turning off the switching elements 11 to 41 can be suppressed.

Fourth Embodiment

Figure 10:
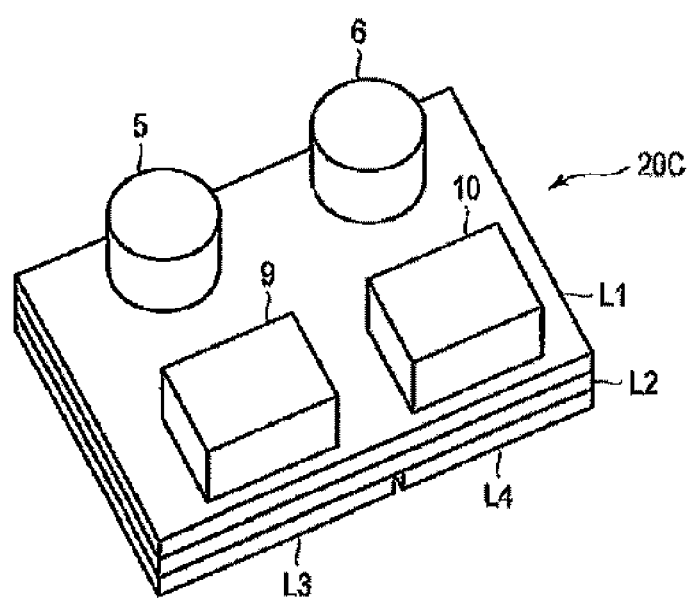
FIG. 10 is a configuration diagram showing a configuration of a three-level power converter according to a fourth embodiment.
Figure 11:
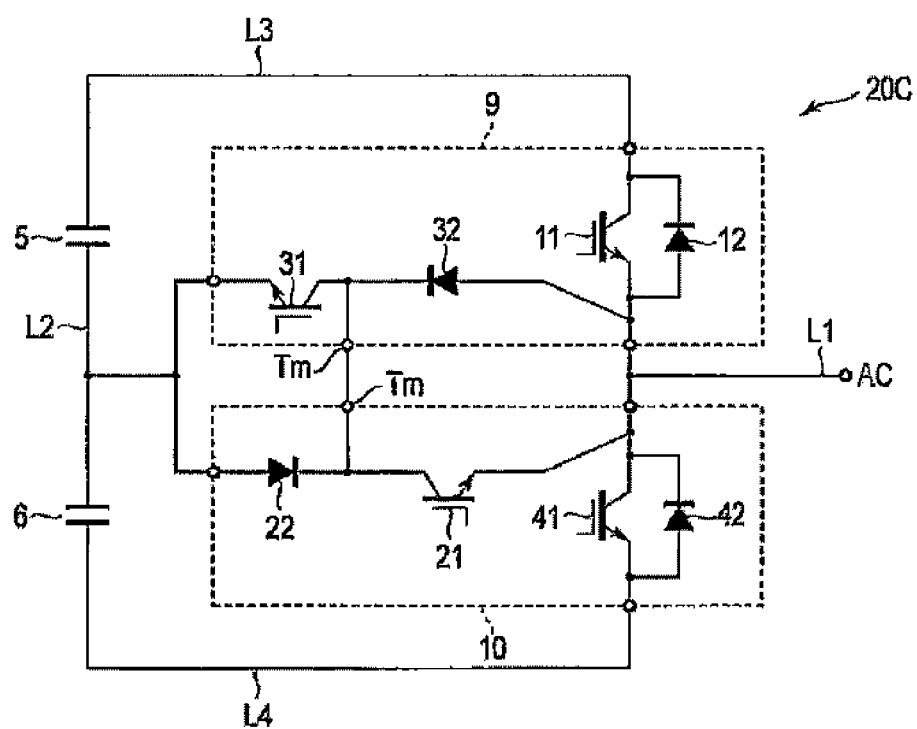
FIG. 11 is a circuit diagram showing a configuration of a power conversion circuit of the three-level power converter according to the fourth embodiment.

FIG. 10 is a configuration diagram showing a configuration of a three-level power converter 20C according to a fourth embodiment of the present invention. FIG. 11 is a circuit diagram showing a configuration of a power conversion circuit of the three-level power converter 20C according to this embodiment.

The three-level power converter 20C is a converter configured such that, in the three-level power converter 20A according to the second embodiment, a ninth semiconductor module 9 is provided as a substitute for the first semiconductor module 1 and the third semiconductor module 3, and a tenth semiconductor module 10 is provided as a substitute for the second semiconductor module 2 and the fourth semiconductor module 4. Other configurations are substantially equal to the corresponding points in the second embodiment.

The ninth semiconductor module 9 is a module obtained by forming the first semiconductor module 1 and the third semiconductor module 3 according to the second embodiment into one semiconductor module. To be more specific, the ninth semiconductor module 9 includes a switching element 11, a diode 12, a switching element 31, and a diode 32. An emitter of the switching element 11 is connected to an anode of the diode 32. With such a configuration, it is possible to reduce the wiring inductance between an electric circuit formed of the switching element 11 and the diode 12 and an electric circuit formed of the switching element 31 and the diode 32. Other configurations are substantially equal to the corresponding points in the configurations of the first semiconductor module 1 and the third semiconductor module 3 according to the second embodiment.

The tenth semiconductor module 10 is a module obtained by forming the second semiconductor module 2 and the fourth semiconductor module 4 into one semiconductor module. To be more specific, the tenth semiconductor module 10 includes a switching element 21, a diode 22, a switching element 41, and a diode 42. An emitter of the switching element 21 is connected to a collector of the switching element 41. With such a configuration, it is possible to reduce the wiring inductance between an electric circuit formed of the switching element 21 and the diode 22 and an electric circuit formed of the switching element 41 and the diode 42. Other configurations are substantially equal to corresponding configurations of the second semiconductor module 2 and the fourth semiconductor module 4 according to the second embodiment.

Figure 12:
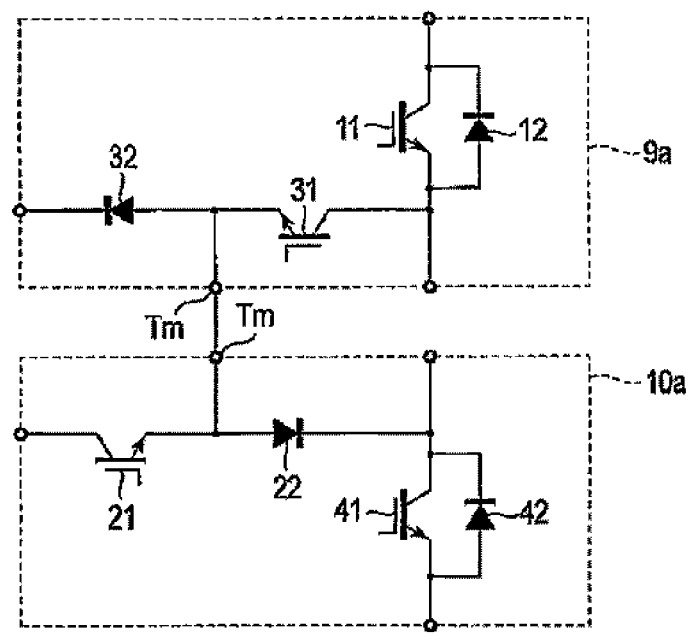
FIG. 12 is a circuit diagram showing configurations of electric circuits of a ninth semiconductor module and a tenth semiconductor module according to a modification of the fourth embodiment.

The ninth semiconductor module 9 and the tenth semiconductor module 10 may be respectively replaced with a ninth semiconductor module 9a and a tenth semiconductor module 10a according to a modification of this embodiment which are shown in FIG. 12. The configurations of a switching element 31a and a diode 32a of the ninth semiconductor module 9a shown in FIG. 12 are equal to corresponding configurations of the third semiconductor module 3a shown in FIG. 3. The configurations of a switching element 21a and a diode 22a of the tenth semiconductor module 10a shown in FIG. 12 are equal to corresponding configurations of the second semiconductor module 2a shown in FIG. 3.

According to this embodiment, it is possible to acquire substantially the same manner of operation and advantageous effects as the second embodiment.

Further, with the use of the ninth semiconductor module 9 and the tenth semiconductor module 10, even if the respective semiconductor modules 9, 10 are disposed at any position, the inductance in a communication loop at the time of turning off the switching elements 11 to 41 can be reduced. Accordingly, a surge voltage at the time of turning off the switching elements 11 to 41 can be suppressed.

The present invention is not limited to the above-mentioned embodiments in the forms described, and can be embodied by applying modifications to the constitutional elements without departing from the gist of the present invention at the stage of carrying out the present invention. Further, by appropriately combining the plurality of constitutional elements disclosed in the above-mentioned embodiments with each other, various inventions can be formed. For example, of all the constitutional elements described in the embodiment, some constitutional elements may be omitted. Further, the constitutional elements described in different embodiments may be appropriately combined with each other.

The invention claimed is:

1. A multilevel power converter in which a power conversion circuit is formed of a plurality of semiconductor modules, the multilevel power converter comprising:
   a first capacitor provided in a positive electrode circuit;
   a second capacitor connected with the first capacitor in series, and provided in a negative electrode circuit;
   a first electric circuit formed of a first switching element through which an electric current flows from the positive electrode circuit to an AC circuit, and a first diode connected with the first switching element in anti-parallel;
   a second electric circuit formed of a second switching element, and a second diode connected with the second switching element in series, the second electric circuit being configured to form an electric path which connects a capacitor circuit formed of the first capacitor and the second capacitor and the AC circuit with each other;
   a third electric circuit formed of a third switching element, and a third diode connected with the third switching element in series, the third electric circuit being configured to form an electric path which connects the capacitor circuit and the AC circuit with each other, and through which an electric current flows in a direction opposite to the second electric circuit;
   a fourth electric circuit formed of a fourth switching element through which an electric current flows from the AC circuit to the negative electrode circuit, and a fourth diode connected with the fourth switching element in anti-parallel;
   an AC bus which is laminated, the AC bus forming the AC circuit;
   a capacitor bus which is laminated, the capacitor bus being stacked with the AC bus and configured to form the capacitor circuit;
   a positive electrode bus which is laminated, the positive electrode bus being stacked with the AC bus and the capacitor bus and configured to form the positive electrode circuit; and
   a negative electrode bus which is laminated, the negative electrode bus being stacked with the AC bus and the capacitor bus and configured to form the negative electrode circuit, wherein
   the AC bus, the capacitor bus, the positive electrode bus or the negative electrode bus are stacked above each other, so as to form three layers in total, with the positive electrode bus and the negative electrode bus being set in one layer,
   the plurality of electric circuits arranged such that each of the first electric circuit and the fourth electric circuit is adjacent to either one of the second electric circuit or the third electric circuit so as to reduce inductance in a communication loop, and
   the electric circuits and the capacitors are disposed on a surface of the AC bus which is present in an uppermost layer, the first electric circuit, the second electric circuit, the third electric circuit, and the fourth electric circuit being arranged in a defined order in one lateral line, the capacitors being disposed parallel to each other in a lateral direction in line separate from the electric circuits.

2. The multilevel power converter according to claim 1, wherein
   the positive electrode bus is stacked with the AC bus and the capacitor bus without overlapping with the negative electrode bus.

3. The multilevel power converter according to claim 1, wherein
the plurality of semiconductor modules includes:
a first semiconductor module in which the first electric circuit is formed;
a second semiconductor module in which the second electric circuit is formed;
a third semiconductor module in which the third electric circuit is formed; and
a fourth semiconductor module in which the fourth electric circuit is formed, wherein
each of the first semiconductor module and the fourth semiconductor module is disposed so as to be adjacent to either one of the second semiconductor module or the third semiconductor module.

4. The multilevel power converter according to claim 3, wherein
the power conversion circuit performs an inverter operation which converts DC power to AC power,
the second electric circuit is formed so as to allow an electric current to flow from the capacitor circuit to the AC circuit,
the first semiconductor module is disposed adjacent to the second semiconductor module, and
the fourth semiconductor module is disposed adjacent to the third semiconductor module.

5. The multilevel power converter according to claim 3, wherein
the power conversion circuit performs a converter operation which converts AC power to DC power,
the second electric circuit is formed so as to allow an electric current to flow from the capacitor circuit to the AC circuit,
the first semiconductor module is disposed adjacent to the third semiconductor module, and
the fourth semiconductor module is disposed adjacent to the second semiconductor module.

6. The multilevel power converter according to claim 1, wherein
the plurality of semiconductor modules includes:
a first semiconductor module in which the first electric circuit and the second electric circuit are formed; and
a second semiconductor module in which the third electric circuit and the fourth electric circuit are formed.

7. The multilevel power converter according to claim 6, wherein
the power conversion circuit performs an inverter operation which converts DC power to AC power, and
the second electric circuit is formed so as to allow an electric current to flow from the capacitor circuit to the AC circuit.

8. The multilevel power converter according to claim 6, wherein
the power conversion circuit performs a converter operation which converts AC power to DC power, and
the second electric circuit is formed so as to allow an electric current to flow from the AC circuit to the capacitor circuit.

* * * * *